(12) United States Patent
Takabe et al.

(10) Patent No.: US 9,751,307 B2
(45) Date of Patent: Sep. 5, 2017

(54) PIEZOELECTRIC DEVICE, LIQUID EJECTION HEAD, AND LIQUID EJECTION APPARATUS

(71) Applicant: SEIKO EPSON CORPORATION, Tokyo (JP)

(72) Inventors: Motoki Takabe, Shiojiri (JP); Shiro Yazaki, Chino (JP); Yuma Fukuzawa, Matsumoto (JP); Eiju Hirai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/192,823

(22) Filed: Jun. 24, 2016

(65) Prior Publication Data

US 2017/0001442 A1 Jan. 5, 2017

(30) Foreign Application Priority Data

Jul. 2, 2015 (JP) .................................. 2015-133270

(51) Int. Cl.
*B41J 2/045* (2006.01)
*B41J 2/14* (2006.01)
(Continued)

(52) U.S. Cl.
CPC ....... *B41J 2/14274* (2013.01); *B41J 2/14233* (2013.01); *H01L 41/0471* (2013.01); *H01L 41/081* (2013.01); *H01L 41/083* (2013.01); *H01L 41/0838* (2013.01); *H01L 41/09* (2013.01); *H01L 41/1876* (2013.01); *H01L 41/332* (2013.01); *B41J 2002/14241* (2013.01); *B41J 2202/11* (2013.01)

(58) Field of Classification Search
CPC .......................... B41J 2/14201; B41J 2/14233
See application file for complete search history.

(56) References Cited

U.S. PATENT DOCUMENTS

| 2007/0120896 A1 | 5/2007 | Stephens et al. |
| 2008/0018204 A1 | 1/2008 | Sugahara |
(Continued)

FOREIGN PATENT DOCUMENTS

| JP | 2014-034114 | 2/2014 |
| JP | 2014-69483 A | 4/2014 |
(Continued)

OTHER PUBLICATIONS

European Search Report for Application No. 16177531.7 dated Dec. 12, 2016.

*Primary Examiner* — Juanita D Jackson
(74) *Attorney, Agent, or Firm* — Workman Nydegger (57) ABSTRACT

An empty chamber component includes a pressure chamber formation substrate where a pressure chamber as an empty chamber is defined and a communication substrate bonded to the pressure chamber formation substrate. A piezoelectric element is provided on one side of the pressure chamber formation substrate. A flexible surface is located between the piezoelectric element and the pressure chamber. Empty portions are defined by the communication substrate closing recessed portions in the pressure chamber formation substrate. The empty portions are formed at positions where ends of the active section of the piezoelectric element pass through the empty portions in plan view.

19 Claims, 6 Drawing Sheets

(51) Int. Cl.
*H01L 41/047* (2006.01)
*H01L 41/08* (2006.01)
*H01L 41/083* (2006.01)
*H01L 41/09* (2006.01)
*H01L 41/187* (2006.01)
*H01L 41/332* (2013.01)

(56) References Cited

U.S. PATENT DOCUMENTS

| | | |
|---|---|---|
| 2009/0109262 A1 | 4/2009 | Cruz-Uribe et al. |
| 2011/0025793 A1* | 2/2011 | Park .................... B41J 2/14233 347/92 |
| 2014/0043401 A1 | 2/2014 | Torimoto et al. |

FOREIGN PATENT DOCUMENTS

| | | |
|---|---|---|
| TW | 200730357 A | 8/2007 |
| WO | 2013-079369 | 6/2013 |

\* cited by examiner

PIEZOELECTRIC DEVICE, LIQUID EJECTION HEAD, AND LIQUID EJECTION APPARATUS

BACKGROUND

1. Technical Field

The present invention relates to a piezoelectric device, a liquid ejection head, and a liquid ejection apparatus and, in particular, to a piezoelectric device, a liquid ejection head, and a liquid ejection apparatus that include piezoelectric elements formed so that flexible surfaces are located between the piezoelectric elements and empty chambers.

2. Related Art

A piezoelectric device including piezoelectric elements is applied to various liquid ejection apparatuses, vibration sensors, or other equipment. For instance, a liquid ejection apparatus ejects (discharges) various liquids from a liquid ejection head by using the piezoelectric device. An example of the liquid ejection apparatus is an image recording apparatus such as an ink jet printer or an ink jet plotter. Since accurate placement of a small amount of liquid at a predetermined position has become possible, the liquid ejection apparatus is also applied to various manufacturing apparatuses. For instance, the liquid ejection apparatus is applied to a display manufacturing apparatus for manufacturing the color filters of liquid crystal displays or the like, an electrode forming apparatus for forming the electrodes of organic electroluminescence (EL) displays, field emission displays (FEDs), or the like, and a chip manufacturing apparatus for manufacturing biochips. A recording head for the image recording apparatus ejects liquid inks. A color material ejection head for the display manufacturing apparatus ejects the color material solutions of red (R), green (G), and blue (B). An electrode material ejection head for the electrode forming apparatus ejects liquid electrode materials. A bioorganic compound ejection head for the chip manufacturing apparatus ejects bioorganic compound solutions.

A liquid ejection head including the piezoelectric device causes pressure fluctuations in liquids in pressure chambers by driving the piezoelectric elements and ejects liquids through nozzles communicating with the pressure chambers. The pressure chambers are formed by performing anisotropic etching on a crystalline substrate such as a silicon substrate. The pressure chambers have portions formed of flexible components and serving as flexible surfaces. Lower electrodes, piezoelectric components formed of a piezoelectric material such as lead zirconate titanate (PZT), and an upper electrode are stacked above the flexible surfaces by a film formation technique. For instance, in the liquid ejection head disclosed in JP-A-2014-34114, the lower electrode of the upper and lower electrodes is patterned for each pressure chamber. Meanwhile, the upper electrode is a common electrode extending over more than one pressure chamber. By employing such a structure, piezoelectric components are mostly covered with the upper electrode. Thus, the upper electrode also functions as a protective film, thereby improving the moisture resistance of the piezoelectric components. In this structure, overlapping portions of the upper electrode, the piezoelectric components, and the lower electrodes in plan view (i.e., when viewed in the direction in which the layers are stacked) are active sections that deform when voltages are applied to the electrodes.

However, in the above structure, the active sections extend beyond the openings of the pressure chambers. Thus, application of a driving voltage to the upper and lower electrodes causes an electric field in end portions of the active sections outside the openings of the pressure chambers. This applies a force to move the end portions. However, a pressure chamber formation substrate has, under the end portions of the active sections, a structure or portions having no empty chamber such as a pressure chamber. Thus, the end portions of the active sections are virtually restrained from moving. This may cause cracking, flaking, or other damage in the end portions of the active sections due to stress concentration.

SUMMARY

An advantage of some aspects of the invention is to provide a piezoelectric device, a liquid ejection head, and a liquid ejection apparatus that are capable of reducing stress in end portions of active sections.

Aspect 1

A piezoelectric device according to this aspect of the invention includes: an empty chamber component defining an empty chamber; and a piezoelectric element provided on one side of the empty chamber component with a flexible surface located between the piezoelectric element and the empty chamber, the piezoelectric element including a first electrode, a piezoelectric component, and a second electrode that are stacked in this order from the side where the flexible surface is formed. In the empty chamber component, an empty portion independent of the empty chamber is formed at a position where an end of an active section passes through the empty portion in plan view, the active section being an overlapping portion of the first electrode, the piezoelectric component, and the second electrode in plan view.

According to this aspect, in the empty chamber component, an empty portion independent of the empty chamber is formed at a position where an end of the active section passes through the empty portion in plan view. That is, a vulnerable portion or a weak portion that is more or less deformable upon application of an external force is intentionally formed. Thus, the portion reduces stress applied when driving the active section of the piezoelectric element. This suppresses cracking, flaking, or other damage in an end portion of the active section of the piezoelectric element.

Aspect 2

In the structure of Aspect 1, the empty chamber component may include (i) an empty chamber formation substrate where the empty chamber is defined and (ii) a flexible component serving as the flexible surface. The empty portion may be defined by the flexible component and a recessed portion in the empty chamber formation substrate.

The distance between the empty portion and an end of the active section is small in this structure. Accordingly, stress applied when driving the active section of the piezoelectric element is reduced more effectively. This suppresses cracking, flaking, or other damage in an end portion of the active section of the piezoelectric element more reliably.

Aspect 3

In the structure of Aspect 1, the empty chamber component may include (i) a first empty chamber formation substrate where the empty chamber is defined and (ii) a second empty chamber formation substrate bonded to a side of the first empty chamber formation substrate, the side being opposite to the side where the piezoelectric element is formed. The empty portion may be defined by the first empty chamber formation substrate and a recessed portion in the second empty chamber formation substrate.

In this structure, the height (depth) of the empty chamber determines the thickness of the first empty chamber formation substrate. The second empty chamber formation substrate where an empty chamber is not formed can be made thicker than the first empty chamber formation substrate. Accordingly, it is easier to form the recessed portion in the second empty chamber formation substrate than in the first empty chamber formation substrate.

Aspect 4

In the structure of Aspect 3, it is preferable that the empty portion include (i) first empty portions defined by the second empty chamber formation substrate and recessed portions in the first empty chamber formation substrate and (ii) second empty portions defined by the first empty chamber formation substrate and recessed portions in the second empty chamber formation substrate. In the empty chamber component, it is preferable that the first empty portions and the second empty portions be alternately formed in a direction in which the empty chambers are arranged in parallel.

A decrease in the strengths of the first empty chamber formation substrate and the second empty chamber formation substrate is suppressed more in the structure where the first empty portions and the second empty portions are alternately formed than in the structure where the empty portions are all formed in one of the substrates. Thus, the structure where the first empty portions and the second empty portions are alternately formed can suppress the risk of damage or the like in these substrates.

Aspect 5

In the structure of any one of Aspects 3 and 4, the flexible surface may be integrally formed with the first empty chamber formation substrate.

In the case where the first empty chamber formation substrate and the flexible surface are different components, the first empty chamber formation substrate and the flexible surface may be dissociated from one another in and near an end of the active section when driving the piezoelectric element. Meanwhile, in the case where the first empty chamber formation substrate and the flexible surface are integrally formed, it is possible to suppress the risk of dissociation of the first empty chamber formation substrate and the flexible surface from one another when driving the piezoelectric element. Even in such a case, an empty portion can be formed in the first empty chamber formation substrate from the side where the second chamber formation substrate is formed, or an empty portion can be formed in the second empty chamber formation substrate. Thus, the empty portion can be formed without any problems.

Aspect 6

A liquid ejection head according to this aspect of the invention includes: the piezoelectric device according to any one of Aspects 1 to 5; and a nozzle that communicates with an empty chamber of the piezoelectric device. Driving of a piezoelectric element of the piezoelectric device causes a pressure change in a liquid in the empty chamber, and the pressure change allows the liquid to be ejected through the nozzle.

Aspect 7

A liquid ejection apparatus according to this aspect of the invention includes the above liquid ejection head.

In the structure of any one of Aspects 6 and 7, stress applied when driving the active section of the piezoelectric element is reduced, thereby suppressing cracking, flaking, or other damage in an end portion of the active section of the piezoelectric element. This improves reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes the embodiments of the invention with reference to the accompanying drawings. It should be noted that in the following embodiments, various features are described as preferable specific examples of the invention. However, the invention is not limited to these examples, unless so stated. As an example, the following describes an ink jet printer (hereinafter referred to as a printer) that is a type of liquid ejection apparatus including an ink jet recording head (hereinafter referred to as a recording head) that is a type of liquid ejection head including a piezoelectric device according to the invention.

Figure 1:
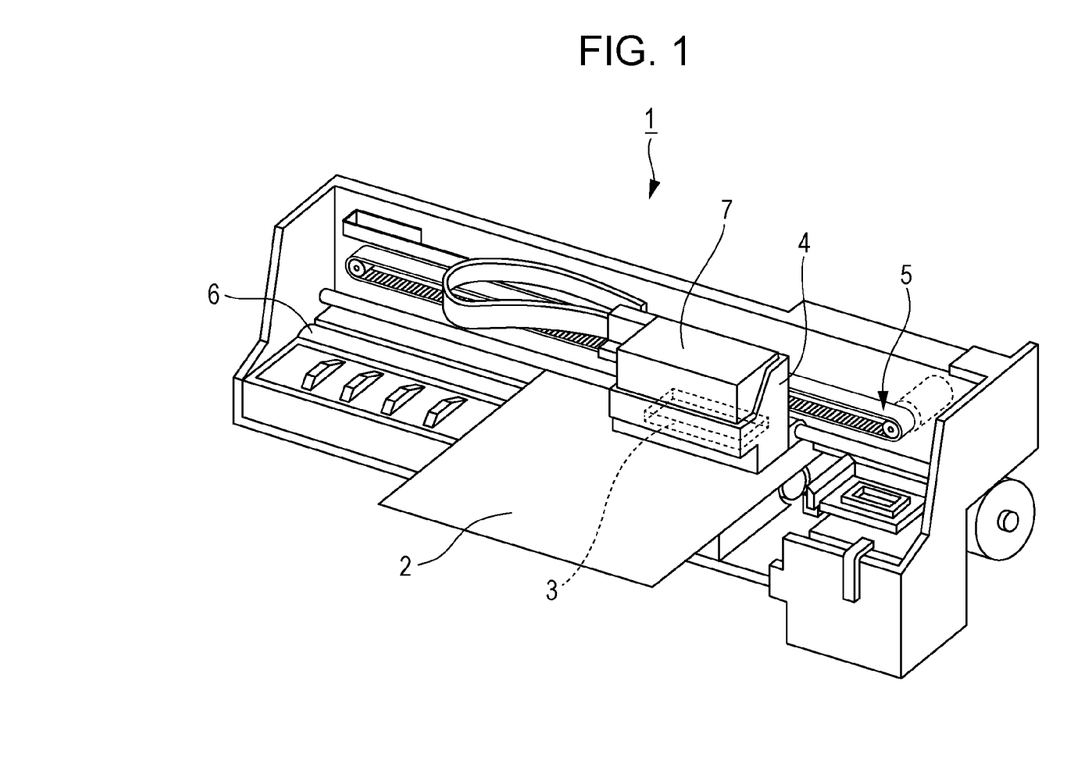
FIG. 1 is a perspective view illustrating the internal structure of a printer.

The following describes the structure of a printer 1 with reference to FIG. 1. The printer 1 is an apparatus that ejects liquid inks onto the surface of a recording medium 2 such as recording paper, and records an image or the like. The printer 1 includes a recording head 3, a carriage 4, a carriage movement mechanism 5, and a platen roller 6. The recording head 3 ejects inks and is attached to the carriage 4. The carriage movement mechanism 5 moves the carriage 4 in a main scanning direction. The platen roller 6 transports the recording medium 2 in a sub-scanning direction. Here, the inks are a type of liquid and are stored in an ink cartridge 7 as a liquid supply source. The ink cartridge 7 is attached to the recording head 3 so as to be detachable. It should be noted that the ink cartridge 7 may be provided in the main body of the printer 1. In this case, inks are supplied from the ink cartridge 7 to the recording head 3 through an ink supply tube.

Figure 2:
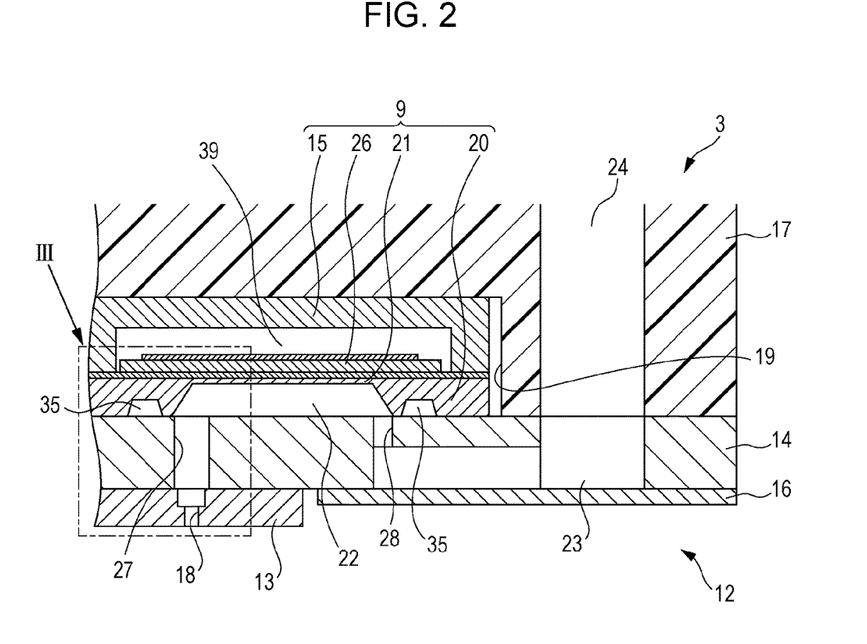
FIG. 2 is a cross-sectional view of the major components of a recording head.
Figure 3:
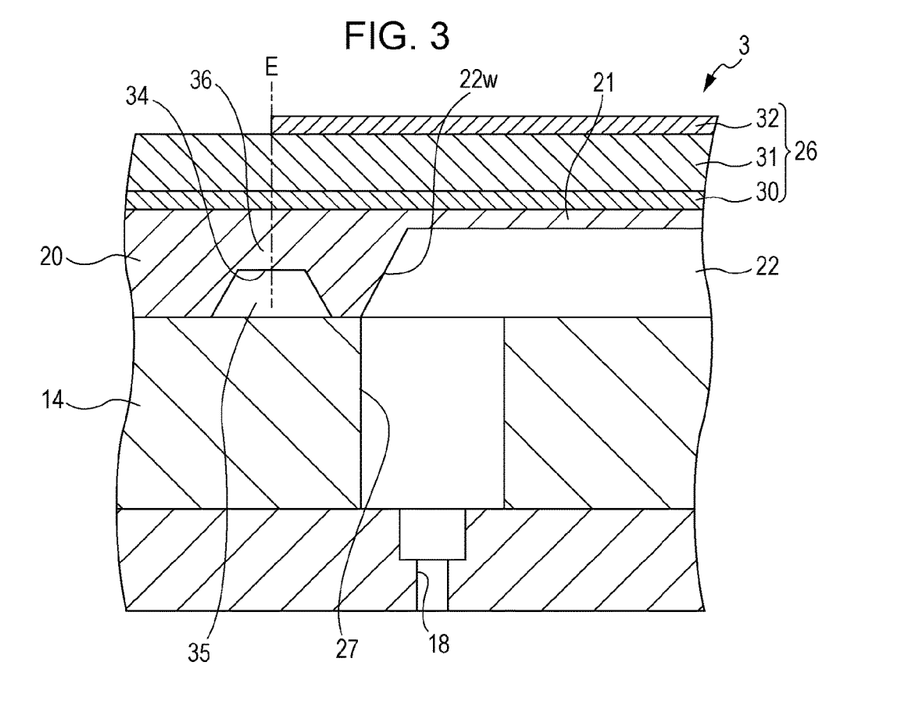
FIG. 3 is an enlarged cross-sectional view of a region III in FIG. 2.

FIG. 2 is a cross-sectional view illustrating the structure of the major components of the recording head 3. FIG. 3 is an enlarged cross-sectional view of a region III in FIG. 2. The recording head 3 in this embodiment includes a pressure generation unit 9 and a flow path unit 12. In a state in which these components are stacked, the recording head 3 is attached to a case 17. The flow path unit 12 includes a nozzle plate 13, a compliance substrate 16, and a communication substrate 14 (corresponding to a second empty chamber formation substrate in the invention). In the pressure generation unit 9, a pressure chamber formation substrate 20 (corresponding to a first empty chamber formation substrate in the invention), a piezoelectric element 26, and a sealing plate 15 are stacked and formed as a unit. In the pressure chamber formation substrate 20, pressure chambers 22 are formed.

The case 17 is a box-shaped component formed of, for example, a synthetic resin. The communication substrate 14, to which the nozzle plate 13 and the pressure generation unit 9 are bonded, is fixed to the bottom of the case 17. A housing empty portion 19 is a cuboid recessed portion formed from the bottom of the case 17 partially into the case 17 in the height direction of the case 17. The positioning of the flow path unit 12 and bonding of the flow path unit 12 to the bottom of the case 17 allows the pressure generation unit 9 formed on the communication substrate 14 to be housed in the housing empty portion 19. An ink introduction empty portion 24 is formed in the case 17. The ink introduction empty portion 24 is an empty portion into which ink is introduced from the ink cartridge 7. An ink that has entered the ink introduction empty portion 24 is introduced into a common liquid chamber 23 (described later) in the communication substrate 14.

Figure 4:
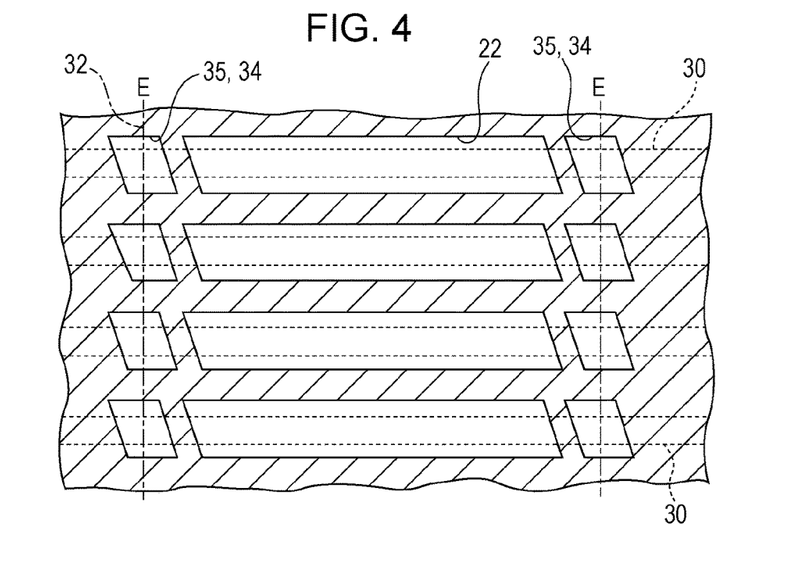
FIG. 4 is a bottom view of a pressure chamber formation substrate.

FIG. 4 is a bottom view of the pressure chamber formation substrate 20. The side where the pressure chamber formation substrate 20 is bonded to the communication substrate 14 is the bottom. In FIG. 4, portions indicated by the broken lines are lower electrodes 30 (corresponding to first electrodes in the invention) of the piezoelectric elements 26. A portion indicated by the one-dot chain lines is an upper electrode 32 (corresponding to a second electrode in the invention) of the piezoelectric elements 26. The pressure chamber formation substrate 20, which is a structural component of the pressure generation unit 9, is formed of a silicon single crystal substrate (hereinafter, also simply referred to as a silicon substrate). Portions of the pressure chambers 22 (corresponding to empty chambers in the invention) or pressure chamber empty portions in this embodiment that define mainly the side walls and ceilings of the pressure chambers 22 are formed in the pressure chamber formation substrate 20 so as to correspond to the nozzles 18 provided in the nozzle plate 13. The pressure chamber empty portions are spaces formed partially in the pressure chamber formation substrate 20 in the thickness direction of the pressure chamber formation substrate 20. To form the pressure chamber empty portions, etching is performed from the bottom side of the pressure chamber formation substrate 20 so that thin wall portions are left on the upper side of the pressure chamber formation substrate 20. The thin wall portions function as flexible surfaces 21 that deform in response to driving of the piezoelectric elements 26. That is, in this embodiment, the pressure chamber formation substrate 20 and the flexible surfaces 21 are integrally formed. The pressure chambers 22 are defined by the communication substrate 14, described later, which closes the openings of the pressure chamber empty portions on the bottom side of the pressure chamber formation substrate 20. The pressure chambers 22 referred to below include the pressure chamber empty portions, where appropriate.

The pressure chambers 22 in this embodiment are empty chambers. In plan view (when viewed in the direction in which the communication substrate 14, the pressure chamber formation substrate 20, and other structural components are stacked), the pressure chambers 22 are substantially parallelograms having longer sides in the direction orthogonal to the direction in which nozzles are arranged. In the pressure chamber 22 (pressure chamber empty portion), walls 22w in the end portions of the pressure chamber 22 in the longitudinal direction of the pressure chamber 22 are inclined relative to the top and bottom of the pressure chamber formation substrate 20. Specifically, the walls 22w are inclined inward toward the top of the pressure chamber formation substrate 20. The pressure chambers 22 respectively correspond to the nozzles 18 in the nozzle plate 13. That is, intervals between the pressure chambers 22 correspond to intervals between the nozzles 18.

Positioning of the pressure chamber formation substrate 20 and bonding of the pressure chamber formation substrate 20 to the communication substrate 14 allow one end portion of the pressure chamber 22 in the longitudinal direction to communicate with the nozzle 18 via a nozzle communication path 27 in the communication substrate 14. The nozzle communication path 27 is described later. The other end portion of the pressure chamber 22 in the longitudinal direction communicates with the common liquid chamber 23 via a supply port 28 in the communication substrate 14. In this embodiment, a stack of the pressure chamber formation substrate 20 and the communication substrate 14 is an empty chamber component in the invention. The combination of the empty chamber component and the piezoelectric elements 26 constitutes the piezoelectric device in the invention.

In this embodiment, recessed portions 34 having bottoms are formed on both sides of the pressure chamber 22 in the longitudinal direction. The recessed portions 34 are formed from the bottom side of the pressure chamber formation substrate 20, extend partially into the pressure chamber formation substrate 20 in the thickness direction of the pressure chamber formation substrate 20, and are shallower than the pressure chamber 22. The recessed portions 34 are formed into substantially parallelograms in plan view by performing anisotropic etching from the bottom of the pressure chamber formation substrate 20 in a way similar to the way the pressure chambers 22 are formed. The anisotropic etching is performed so that portions corresponding to the base plates of the recessed portions 34 are left as vulnerable portions 36. The openings of the recessed portions 34 on the bottom side of the pressure chamber formation substrate 20 are closed by the communication substrate 14 by bonding the communication substrate 14 to the bottom of the pressure chamber formation substrate 20. Thus, empty portions 35 are defined by the communication substrate 14 and the recessed portions 34 in the pressure chamber formation substrate 20. As FIG. 4 illustrates, two empty portions 35 are formed for each pressure chamber 22 at positions where both ends E of the active section of the piezoelectric element 26 pass through the empty portions 35 in plan view. The empty portions 35 are independent spaces that do not communicate with ink flow paths such as the pressure chambers 22, and are filled with air.

The piezoelectric elements 26 are formed at positions on the top surface of the pressure chamber formation substrate 20 that correspond to the positions of the pressure chambers 22, i.e., formed in areas on the top surface of the pressure chamber formation substrate 20 that correspond to the flexible surfaces 21. The piezoelectric elements 26 in this embodiment are those of a deformation mode. In the piezoelectric element 26, the lower electrode 30 made of a metal, the piezoelectric 31 made of lead zirconate titanate (PZT) or another material, and the upper electrode 32 made of a metal are stacked above the pressure chamber formation substrate 20 in this order. The piezoelectric element 26 in this embodiment extends beyond the ends of the pressure chamber 22 (to positions outside the flexible surface 21) in the longitudinal direction and is formed on the pressure chamber formation substrate 20. As FIGS. 3 and 4 illustrate, the lower electrodes 30 and the piezoelectric components 31 further extend beyond the end portions of the upper electrode 32 in the longitudinal direction of the pressure chamber 22.

In this embodiment, the lower electrode 30 and the piezoelectric 31 are patterned for each pressure chamber 22. The lower electrodes 30 respectively correspond to the pressure chambers 22. Meanwhile, the upper electrode 32 is common to the piezoelectric elements 26. In plan view, i.e., in the direction in which the layers are stacked, the overlapping portions of the upper electrode 32, the piezoelectric components 31, and the lower electrodes 30 are active sections where piezoelectric strain is caused by applying a voltage to the upper electrode 32 and the lower electrodes 30. Thus, the ends of the upper electrode 32 in the longitudinal direction of the pressure chambers 22 practically determine the ends E of the active sections. It should be noted that the lower electrode 30 may be common to the piezoelectric elements 26 while the upper electrodes 32 respectively correspond to the piezoelectric elements 26.

The sealing plate 15 is provided above the top of the pressure chamber formation substrate 20 on which the piezoelectric elements 26 are formed. The sealing plate 15 is made of, for example, a glass, a ceramic material, a silicon single crystal substrate, a metal, or a synthetic resin. In the sealing plate 15, a piezoelectric element housing empty portion 39 is formed in a region opposite the piezoelectric elements 26. The piezoelectric element housing empty portion 39 has a size that does not hinder the driving of the piezoelectric elements 26. In a state in which the piezoelectric element housing empty portion 39 houses mainly the active sections of the piezoelectric elements 26, the sealing plate 15 is bonded to the top surface of the pressure chamber formation substrate 20. A wiring empty portion (not illustrated) is formed in the sealing plate 15, penetrating the sealing plate 15 in the thickness direction of the sealing plate 15. Electrode terminals extending from the piezoelectric elements 26 are provided in the wiring empty portion. The terminals of wiring components (not illustrated) are electrically connected to the electrode terminals.

The nozzle plate 13 and the compliance substrate 16 are bonded to the bottom of the communication substrate 14. The nozzle plate 13 is a plate having the nozzles 18 and is formed of a silicon substrate in this embodiment. The nozzles 18 are formed into cylinders by performing dry etching on the substrate. The nozzle plate 13 is bonded to the center portion of the bottom of the communication substrate 14 so that the nozzles 18 respectively communicate with the nozzle communication paths 27. The compliance substrate 16 is a flexible component that is bonded to the bottom of the communication substrate 14 so as to close the opening of the common liquid chamber 23. The compliance substrate 16 has the function of absorbing a pressure change in an ink in the common liquid chamber 23.

The communication substrate 14 is a plate formed of a silicon substrate that is the material of the pressure chamber formation substrate 20. Empty portions to be used as the nozzle communication paths 27 and the common liquid chamber 23 are formed in the communication substrate 14 by the anisotropic etching. The nozzle communication paths 27 are formed in the direction in which the pressure chambers 22 are arranged in parallel, i.e., the direction in which the nozzles are arranged so as to correspond to the pressure chambers 22. In the state in which the pressure chamber formation substrate 20 is positioned and bonded to the communication substrate 14, each nozzle communication path 27 communicates with one end portion of the corresponding pressure chamber 22 in the longitudinal direction of the pressure chamber 22. The common liquid chamber 23 extends in the direction in which the nozzles are arranged, i.e., the direction in which the pressure chambers 22 are arranged in parallel. The common liquid chamber 23 is an empty portion into which an ink is introduced and is common to the pressure chambers 22. In the state where the communication substrate 14 is positioned and bonded to the case 17, the common liquid chamber 23 communicates with the ink introduction empty portion 24, and an ink is introduced from the ink cartridge 7 into the common liquid chamber 23 through the ink introduction empty portion 24. The common liquid chamber 23 and the pressure chambers 22 communicate via the supply ports 28 respectively corresponding to the pressure chambers 22. Thus, the ink in the common liquid chamber 23 is distributed to the pressure chambers 22 via the supply ports 28.

In the recording head 3, the active sections of the piezoelectric elements 26 extend beyond the flexible surfaces 21 of the pressure chambers 22 in the pressure chamber formation substrate 20. Thus, application of driving voltages to the upper electrode 32 and the lower electrodes 30 causes electric fields between the upper electrode 32 and the lower electrodes 30 in the end portions of the active sections outside openings in the top portions of the pressure chambers 22. This applies a force to move the end portions of the active sections. In a recording head of the related art having a similar structure, a substrate where pressure chambers are formed has, under the end portions of the active sections outside the flexible surfaces of the pressure chambers, a structure or portions having no empty chamber such as a pressure chamber. Thus, the end portions of the active sections are virtually restrained from moving. This may cause cracking, flaking, or other damage in the end portions of the active sections due to stress concentration. To address such a problem, the recording head 3 according to the invention has the following structure. As described above, the empty portions 35 are formed at the positions where both ends E of the active sections of the piezoelectric elements 26 pass through the empty portions 35 in plan view. That is, vulnerable portions or weak portions that are more or less deformable upon application of an external force are intentionally formed. Accordingly, these portions reduce stress applied when driving the active sections of the piezoelectric elements 26. This suppresses cracking, flaking, or other damage in the end portions of the active sections of the piezoelectric elements 26 (in the electrodes in particular). Moreover, the empty portions 35 are spaces independent of ink flow paths such as the pressure chambers 22. Thus, the empty portions 35 do not influence the ejection features of inks in the nozzles 18 (such as the weight of an ink to be ejected or the speed at which the ink is discharged).

If a pressure chamber formation substrate and flexible surfaces (flexible components) are different components, the pressure chamber formation substrate and the flexible components may be dissociated from one another in and near ends of active sections when driving piezoelectric elements. However, in this embodiment, the pressure chamber formation substrate 20 and the flexible surfaces 21 are integrally formed, thereby suppressing the risk of dissociation of the pressure chamber formation substrate 20 and the flexible surfaces 21 from one another when driving the piezoelectric elements 26. Moreover, even in the structure where the pressure chamber formation substrate 20 and the flexible surfaces 21 are integrally formed, the recessed portions 34, with which the empty portions 35 are defined, are formed into the pressure chamber formation substrate 20, from the side where the communication substrate 14 is formed. Thus, the empty portions 35 can be formed without any problems. Moreover, in this embodiment, the recessed portions 34 are formed in the pressure chamber formation substrate 20 in the same etching process as the pressure chambers 22. Thus, the number of processes does not increase.

Figure 5:
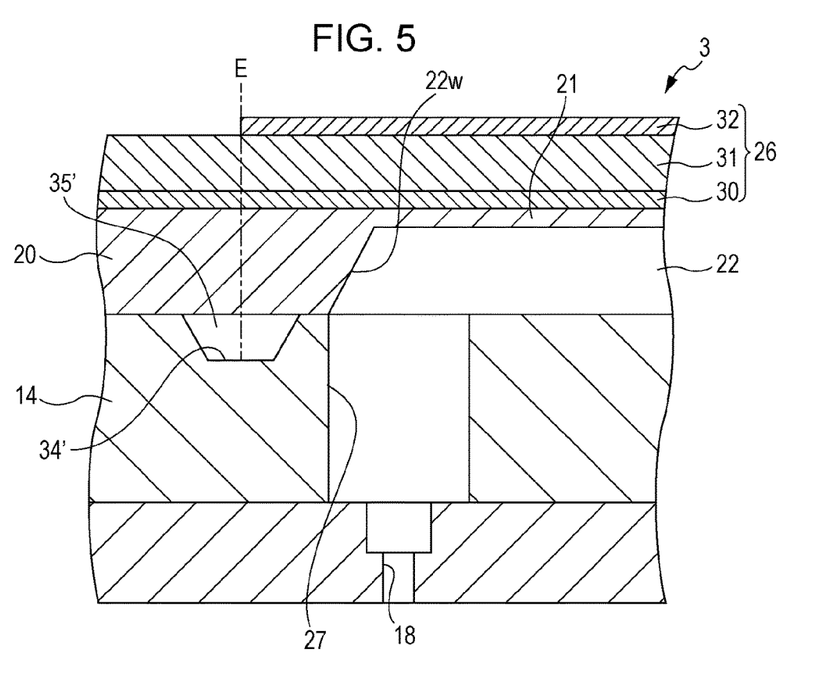
FIG. 5 is an enlarged cross-sectional view of the major components of a recording head in Embodiment 2.

FIG. 5 is a cross-sectional view of the major components of a recording head 3 in Embodiment 2 of the invention. In Embodiment 1, the empty portions 35 are defined by the communication substrate 14 and the recessed portions 34 in the pressure chamber formation substrate 20. However, other structures are also possible. In Embodiment 2, recessed portions 34' are formed in a communication substrate 14, and empty portions 35' are defined by a pressure chamber formation substrate 20 closing the recessed portions 34'. Embodiments 1 and 2 are different in this respect. That is, to ensure the strengths of partitions between pressure chambers 22, the heights (depths) of the pressure chambers 22 are less than those of a common liquid chamber 23, nozzle communication paths 27, and other components. Accordingly, the thickness (for instance, 40 µm or more and 100 µm or less) of the pressure chamber formation substrate 20 is less than the thickness (for instance, 200 µm or more and 500 µm or less) of the communication substrate 14. Thus, the recessed portions 34' are more easily formed in the communication substrate 14 that is thicker than the pressure chamber formation substrate 20. Moreover, the substrates are more difficult to break in this structure. Also in Embodiment 2, the empty portions 35' are formed at positions where both ends E of the active sections of piezoelectric elements 26 pass through the empty portions 35' in plan view. This reduces stress applied when driving the piezoelectric elements 26. It should be noted that the structures of Embodiments 1 and 2 are the same except for the above differences.

Figure 6:
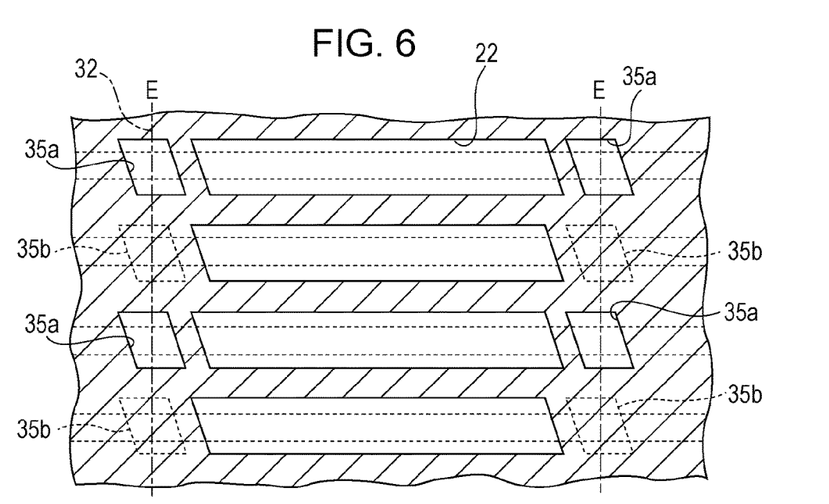
FIG. 6 is a bottom view of a pressure chamber formation substrate in Embodiment 3.
Figure 7:
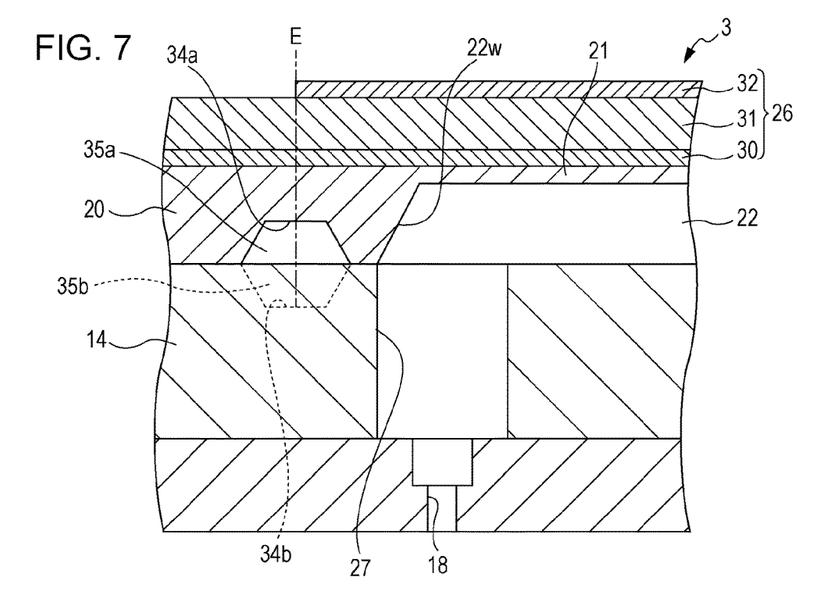
FIG. 7 is an enlarged cross-sectional view of the major components of a recording head in Embodiment 3.

FIGS. 6 and 7 illustrate the structure of Embodiment 3 of the invention. FIG. 6 is a bottom view of a pressure chamber formation substrate 20. FIG. 7 is a cross-sectional view of the major components of a recording head 3. In this embodiment, (i) first empty portions 35a defined by a communication substrate 14 and recessed portions 34a in the pressure chamber formation substrate 20 and (ii) second empty portions 35b defined by the pressure chamber formation substrate 20 and recessed portions 34b in the communication substrate 14 are alternately formed in the direction in which nozzles are arranged, i.e., the direction in which pressure chambers 22 are arranged in parallel. In this respect, Embodiment 3 is different from Embodiments 1 and 2. In the structure where recessed portions are all formed in one of the pressure chamber formation substrate 20 and the communication substrate 14, the substrate where the recessed portions are formed may be vulnerable and may break, for example. However, the alternate formation of the first empty portions 35a and the second empty portions 35b as described in this embodiment suppresses a decrease in the strengths of the pressure chamber formation substrate 20 and the communication substrate 14. This may suppress the risk of damage or the like in the substrates. Also in Embodiment 3, similarly to Embodiment 1, the first empty portions 35a and the second empty portions 35b are formed at positions where both ends E of the active sections of piezoelectric elements 26 pass through the first empty portions 35a and the second empty portions 35b in plan view. This reduces stress applied when driving the piezoelectric elements 26. It should be noted that the structures of Embodiments 1 and 3 are the same except for the above differences.

Figure 8:
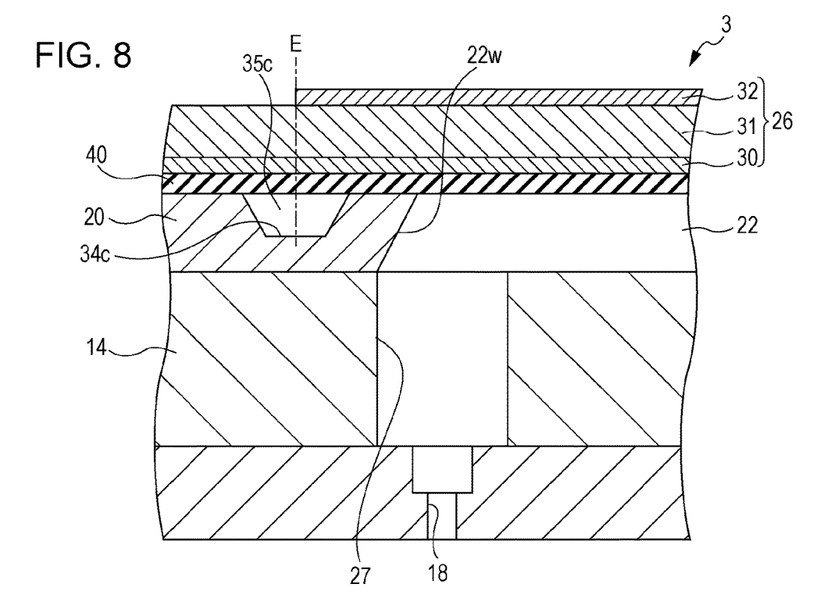
FIG. 8 is an enlarged cross-sectional view of the major components of a recording head in Embodiment 4.

FIG. 8 is a cross-sectional view of the major components of a recording head 3 in Embodiment 4 of the invention. In Embodiment 4, pressure chamber empty portions are formed in a pressure chamber formation substrate 20 and penetrate the pressure chamber formation substrate 20 in the thickness direction of the pressure chamber formation substrate 20. Pressure chambers 22 are defined by bonding an elastic film 40 (corresponding to a flexible component in the invention) and a communication substrate 14 to the pressure chamber formation substrate 20. The elastic film 40 includes, for example, a first layer of silicon dioxide ($SiO_2$) and a second layer of zirconium oxide ($ZrO_2$) formed on the first layer. Portions of the elastic film 40 that close the openings in the tops of the pressure chambers 22 serve as flexible surfaces that deform in response to driving of piezoelectric elements 26 (active sections). Moreover, in the thickness direction of the pressure chamber formation substrate 20, recessed portions 34c are formed partially in the pressure chamber formation substrate 20 from the top of the pressure chamber formation substrate 20 toward the bottom. The elastic film 40 closes the openings of the recessed portions 34c on the top side of the pressure chamber formation substrate 20. Thus, empty portions 35c are defined by the elastic film 40 and the recessed portions 34c in the pressure chamber formation substrate 20. In the direction in which the pressure chamber formation substrate 20 and the communication substrate 14 are stacked, the distance between the empty portion 35c and an end E of the active section of piezoelectric element 26 is small in this structure. This more effectively reduces stress applied when driving the active sections of the piezoelectric elements 26. This suppresses cracking, flaking, or other damage in end portions of the active sections of the piezoelectric elements 26 more reliably. It should be noted that the structures of Embodiments 1 and 4 are the same except for the above differences.

Figure 9:
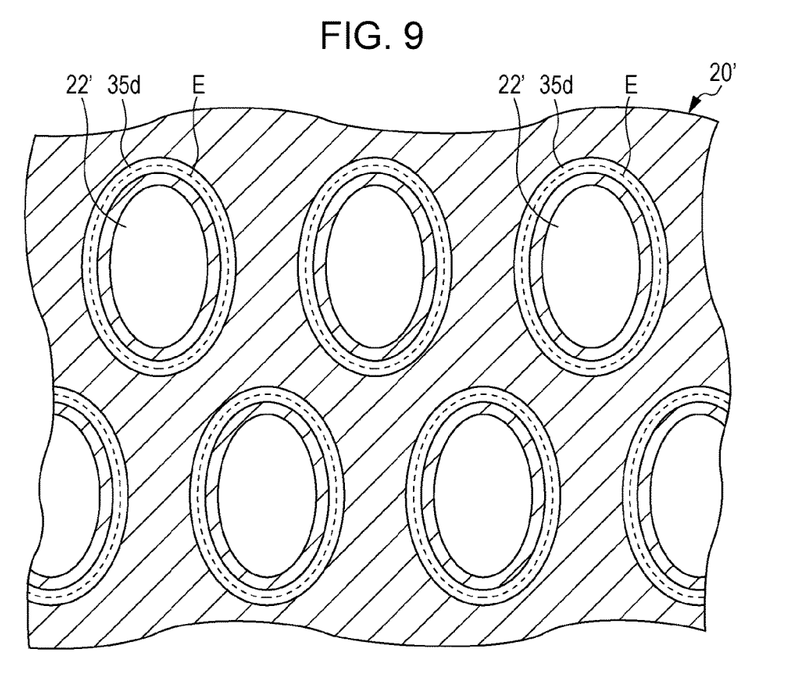
FIG. 9 is a bottom view of a pressure chamber formation substrate in Embodiment 5.
Figure 10:
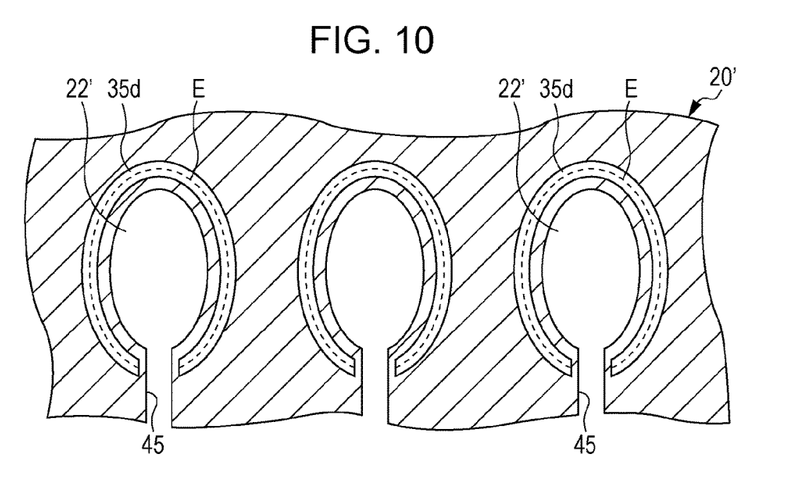
FIG. 10 is a bottom view of a pressure chamber formation substrate in a modification example of Embodiment 5.

FIG. 9 is a plan view of a pressure chamber substrate 20' in Embodiment 5 of the invention. Pressure chambers 22' in this embodiment are elliptical or rhomboidal in plan view. Moreover, the broken lines in FIG. 9 indicate ends E of active sections defined by the shapes of the respective electrodes of piezoelectric elements 26. That is, the ends E of the active sections in this embodiment are also outside the pressure chambers 22' (beyond flexible surfaces). Groove-shaped empty portions 35d are formed in the pressure chamber substrate 20' or in a substrate making up an empty chamber component together with the pressure chamber substrate 20'. In plan view, the empty portions 35d are annuli formed along the entire perimeters of the ends E of the active sections and are formed at positions where the ends E of the active sections are in the empty portions 35d. Also in such a structure, since the empty portions 35d are formed at the positions where the ends E of the active sections of the piezoelectric elements 26 are in the empty portions 35d in plan view, stress applied when driving the piezoelectric elements 26 is reduced. This suppresses cracking, flaking, or other damage in end portions of the active sections of the piezoelectric elements 26. It should be noted that as shown by the modification example in FIG. 10, in the structure where supply paths 45 that communicate with the pressure chambers 22' are formed in the pressure chamber substrate 20', the empty portions 35d are not necessarily formed along the entire perimeters of the ends E of the active sections. For instance, the empty portions 35d may be formed so as to avoid the supply paths 45 and to each have a horseshoe shape in plan view.

The piezoelectric devices of the recording heads 3 in the above embodiments include the pressure chamber formation substrates 20, the communication substrates 14, and the piezoelectric elements 26. However, the invention is applicable to other piezoelectric devices including piezoelectric elements and empty chamber components defining empty chambers. Moreover, the invention is also applicable to liquid ejection heads such as a color material ejection head for use in the manufacturing of the color filters of liquid crystal displays or the like, an electrode material ejection head for use in forming the electrodes of organic electroluminescence (EL) displays, field emission displays (FEDs), or the like, and a bioorganic compound ejection head for use in the manufacturing of biochips.

The entire disclosure of Japanese Patent Application No: 2015-133270, filed Jul. 2, 2015 is expressly incorporated by reference herein in its entirety.

What is claimed is:

1. A piezoelectric device comprising:
an empty chamber component defining an empty chamber; and
a piezoelectric element provided on one side of the empty chamber component with a flexible surface located between the piezoelectric element and the empty chamber, the piezoelectric element including a first electrode, a piezoelectric component, and a second electrode that are stacked in this order from a side where the flexible surface is formed,
wherein in the empty chamber component, an empty portion independent of the empty chamber is formed at a position where an end of an active section overlaps the empty portion in plan view, the active section being an overlapping portion of the first electrode, the piezoelectric component, and the second electrode in plan view.

2. The piezoelectric device according to claim 1,
wherein the empty chamber component includes (i) an empty chamber formation substrate where the empty chamber is defined and (ii) a flexible component serving as the flexible surface, and
the empty portion is defined by the flexible component and a recessed portion in the empty chamber formation substrate.

3. A liquid ejection head comprising:
the piezoelectric device according to claim 2; and
a nozzle that communicates with the empty chamber of the piezoelectric device,
wherein driving of a piezoelectric element of the piezoelectric device causes a pressure change in a liquid in the empty chamber, and the pressure change allows the liquid to be ejected through the nozzle.

4. The piezoelectric device according to claim 1,
wherein the empty chamber component includes (i) a first empty chamber formation substrate where the empty chamber is defined and (ii) a second empty chamber formation substrate bonded to a side of the first empty chamber formation substrate, the side being opposite to a side where the piezoelectric element is formed, and the empty portion is defined by the first empty chamber formation substrate and a recessed portion in the second empty chamber formation substrate.

5. The piezoelectric device according to claim 4,
wherein the empty portion includes (i) first empty portions defined by the second empty chamber formation substrate and recessed portions in the first empty chamber formation substrate and (ii) second empty portions defined by the first empty chamber formation substrate and recessed portions in the second empty chamber formation substrate, and
in the empty chamber component, the first empty portions and the second empty portions are alternately formed in a direction in which a plurality of the empty chambers are arranged in parallel.

6. A liquid ejection head comprising:
the piezoelectric device according to claim 5; and
a nozzle that communicates with the empty chamber of the piezoelectric device,
wherein driving of a piezoelectric element of the piezoelectric device causes a pressure change in a liquid in the empty chamber, and the pressure change allows the liquid to be ejected through the nozzle.

7. The piezoelectric device according to claim 4,
wherein the flexible surface is integrally formed with the first empty chamber formation substrate.

8. A liquid ejection head comprising:
the piezoelectric device according to claim 7; and
a nozzle that communicates with the empty chamber of the piezoelectric device,
wherein driving of a piezoelectric element of the piezoelectric device causes a pressure change in a liquid in the empty chamber, and the pressure change allows the liquid to be ejected through the nozzle.

9. A liquid ejection head comprising:
the piezoelectric device according to claim 4; and
a nozzle that communicates with the empty chamber of the piezoelectric device,
wherein driving of a piezoelectric element of the piezoelectric device causes a pressure change in a liquid in the empty chamber, and the pressure change allows the liquid to be ejected through the nozzle.

10. A liquid ejection head comprising:
the piezoelectric device according to claim 1; and
a nozzle that communicates with the empty chamber of the piezoelectric device,
wherein driving of a piezoelectric element of the piezoelectric device causes a pressure change in a liquid in the empty chamber, and the pressure change allows the liquid to be ejected through the nozzle.

11. A liquid ejection apparatus comprising the liquid ejection head according to claim 10.

12. A piezoelectric device comprising:
a chamber component defining an pressure chamber; and
a piezoelectric element provided on one side of the chamber component with a flexible surface located between the piezoelectric element and the pressure chamber, the piezoelectric element including a first electrode, a piezoelectric component, and a second electrode that are arranged in this order from a side where the flexible surface is formed,
wherein in the chamber component, an chamber portion independent of the pressure chamber is formed at a position where an end of an active section overlaps the chamber portion in plan view, the active section being an overlapping portion of the first electrode, the piezoelectric component, and the second electrode in plan view.

13. The piezoelectric device according to claim 12, wherein the chamber portion is shallower than the pressure chamber.

14. A liquid ejection head comprising:
the piezoelectric device according to claim 12; and
a nozzle that communicates with the pressure chamber of the piezoelectric device
wherein driving of a piezoelectric element of the piezoelectric device causes a pressure change in a liquid in the pressure chamber, and the pressure change allows the liquid to be ejected through the nozzle.

15. A liquid ejection apparatus comprising the liquid ejection head according to claim 14.

16. A piezoelectric device comprising:
a chamber component defining an first chamber; and
a piezoelectric element provided on one side of the chamber component with a flexible surface located between the piezoelectric element and the first chamber, the piezoelectric element including a first electrode, a piezoelectric component, and a second electrode that are arranged in this order from a side where the flexible surface is formed,
wherein in the chamber component, an second chamber is formed at a position where an end of an active section overlaps the second chamber in plan view, a wall is formed between the first chamber and second chamber in the chamber component, the active section being an overlapping portion of the first electrode, the piezoelectric component, and the second electrode in plan view.

17. The piezoelectric device according to claim 16, wherein the second chamber is shallower than the first chamber.

18. A liquid ejection head comprising:
the piezoelectric device according to claim 16; and
a nozzle that communicates with the first chamber of the piezoelectric device,
wherein driving of a piezoelectric element of the piezoelectric device causes a pressure change in a liquid in the first chamber, and the pressure change allows the liquid to be ejected through the nozzle.

19. A liquid ejection apparatus comprising the liquid ejection head according to claim 18.

* * * * *